United States Patent
Hsieh et al.

(10) Patent No.: US 7,344,914 B2
(45) Date of Patent: Mar. 18, 2008

(54) ORGANIC SEMICONDUCTOR ELEMENT HAVING MULTI PROTECTION LAYERS AND PROCESS OF MAKING THE SAME

(75) Inventors: Cheng-Chung Hsieh, Hsinchu (TW);
Liang-Ying Huang, Hsinchu (TW);
Tarng-Shiang Hu, Hsinchu (TW);
Cheng-chung Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 49 days.

(21) Appl. No.: 11/149,158

(22) Filed: Jun. 10, 2005

(65) Prior Publication Data
US 2006/0180808 A1    Aug. 17, 2006

(30) Foreign Application Priority Data
Feb. 16, 2005    (TW) ............................... 94104491 A

(51) Int. Cl.
*H01L 21/00*    (2006.01)
(52) U.S. Cl. .................. 438/99; 438/149; 257/E51.001
(58) Field of Classification Search .................. 438/99, 438/141–166
See application file for complete search history.

(56) References Cited

U.S. PATENT DOCUMENTS 6,461,775 B1 * 10/2002 Pokorny et al. ............... 430/7
2006/0240668 A1 * 10/2006 Rudin ........................ 438/678

* cited by examiner

*Primary Examiner*—Savitri Mulpuri
(74) *Attorney, Agent, or Firm*—Rabin & Berdo, P.C.

(57) ABSTRACT

An organic semiconductor element having multi protection layers and process of making the same are provided. Firstly, forming a first protection layer on the thin film transistor. Next, forming a second protection layer which is thick enough to serve as the photo spacers on said first protection layer. The multi protection layers are then grown on said organic thin film transistor, so as to enable the second protection layer to have the additional function of the photo spacers by the patterning process. Thus the organic thin film transistor can be prevented from being damaged, and achieving the simplification of the manufacturing process and the reduction of the production cost.

11 Claims, 7 Drawing Sheets

ORGANIC SEMICONDUCTOR ELEMENT HAVING MULTI PROTECTION LAYERS AND PROCESS OF MAKING THE SAME

BACKGROUND OF THE INVENTION

1. Field of the Invention

The invention relates to an organic semiconductor element and a method of its manufacturing, in particular to an organic semiconductor element having multi protection layers and process of making the same.

2. Related Art

The organic semiconductor device has been the hot topic and keen interest of the scientific research in recent years. With regard to the organic thin film transistor (OFET), its unique and advanced technology of flexible substrate has already gained a most prominent and promising place in this field. The thin film transistor is mainly made of organic material, and it is essential and indispensable to the roll-to-roll (R2R) manufacturing process, due to its basic property of intrinsic flexibility. The application and utilization of the organic thin film transistor in cooperation/coordination with the liquid crystal display panel may further expand the scope of application of the organic thin film transistors.

In the application of the organic thin film transistor in cooperation with the liquid crystal display panel, the processes of manufacturing the protection layers and the photo spacers are essential. In the past, the photo spacers were formed on the protection layer of the organic thin film transistor after its completion, by means of the spraying method. Due to the fact that it is extremely difficult to have effective control of the spray distribution density, the application of this process is liable to lead to the local concentration and condensation of the photo spacers, thus affecting the evenness of the surface of the substrate and the overall quality of the image. In addition, the requisition and installation of the spraying device increase the production cost significantly.

Therefore, the acquisition of a proper solution to this problem to improve and optimize the manufacturing process of the protection layers and the photo spacers of the organic semiconductor element, for example, of the above-mentioned organic thin film transistor, is the most important task for research and development in this field.

SUMMARY OF THE INVENTION

In view of the above-mentioned problems and shortcomings of the prior art, the object of the invention is to provide an organic semiconductor element, having multi protection layers, and its manufacturing method, which are utilized to solve the overall problem of the prior art by forming the multi protection layers on the organic thin film transistor, wherein the second protection layer is of sufficient thickness, to enable the multi protection layers to effectively protect the organic thin-film-transistor through the patterning process. In addition, the second protection layer can be utilized as photo spacers, so as to eliminate the process of disposing the photo spacers and solve the problem of the prior art.

To achieve the above-mentioned objective, the invention provides an organic semiconductor element having multi protection layers, comprising a thin film transistor, a first protection layer, and a second protection layer, wherein the first protection layer is formed on the organic thin film transistor, and the second protection layer is formed on the first protection layer by the patterning process, such, that the second protection layer is of sufficient thickness to serve as the photo spacers. Thus, the second protection layer is capable of providing both functions of the protection layer and the photo spacers, so as to achieve the purpose of reducing the manufacturing cost.

Besides, the invention provides a process of making for the organic semiconductor element having multi protection layers, comprising the following steps. Firstly, providing an organic thin film transistor; then, forming a first protection layer on the thin film transistor. Subsequently, forming the second protection layer on the first protection layer, such, that the second protection layer is thick enough to be utilized as photo spacers. Finally, patterning the second protection layer to form the organic semiconductor element having multi protection layers.

In the above-mentioned organic semiconductor element, the second protection layer is used to separate the substrate from the first protection layer of the organic thin film transistor, thus replacing the step of the prior art of spraying the photo spacers on the protection layer after the completion of the protection layer, so as to simply the manufacturing process, so that the photo spacers can be distributed more evenly on the substrate of an organic thin film transistor. Alternatively, the top ITO (Indium Tin Oxide) electrode type of the organic thin film transistor substrate could be utilized in the invention, such, that the contact hold is made in the second protection layer, which is used to penetrate the second protection layer and the first protection layer to expose the organic thin film transistor. Therefore, the second protection layer is capable of having both the functions of an over-coat layer and a protection layer, and finally the electrode is formed on top of the second protection layer and connected electrically to the organic thin film transistor through the contact hole.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given below, which is for illustration only and thus is not limitative of the present invention, wherein.

DETAILED DESCRIPTION OF THE INVENTION

The purpose, construction, features, and functions of the present invention can be appreciated and understood further through the following detailed description with reference to the attached drawings.

Figure 1:
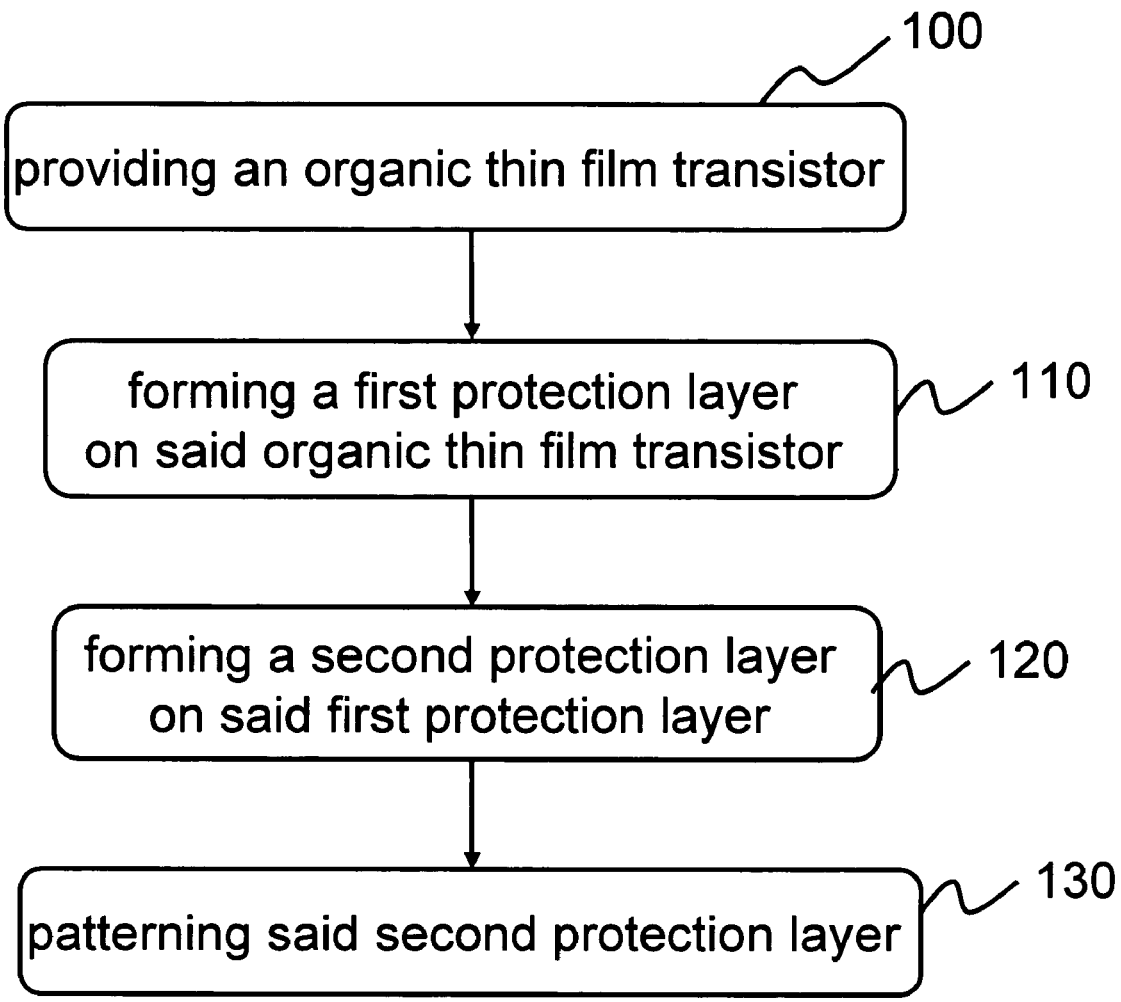
FIG. 1 is a flowchart of the process of making the organic semiconductor element having multi protection layers according to the invention.

Refer to FIG. 1, which shows the system flowchart for the process of making the organic semiconductor element having multi protection layers according to the first embodiment of the invention, mainly comprising the following steps.

Firstly, providing an organic thin film transistor (step 100). Next, forming a first protection layer on the organic thin film transistor (step 110). Then, forming a second protection layer on the first protection layer by means of the vapor deposition or the solution treatment process (step 120), mentioned second protection layer must be of sufficient thickness to serve as the photo spacers. Finally, patterning the second protection layer (step 130), so as to realize the organic semiconductor element having multi protection layers.

In the following illustrations, the organic semiconductor element having multi protection layers and the method of its manufacturing are described in detail by the embodiments. Please refer to FIG. 2A to 2D for the schematic diagrams illustrating the cross sections of mentioned element in the various manufacturing processes of the organic semiconductor element having multi protection layers according to the first embodiment of the invention.

Figure 2A:
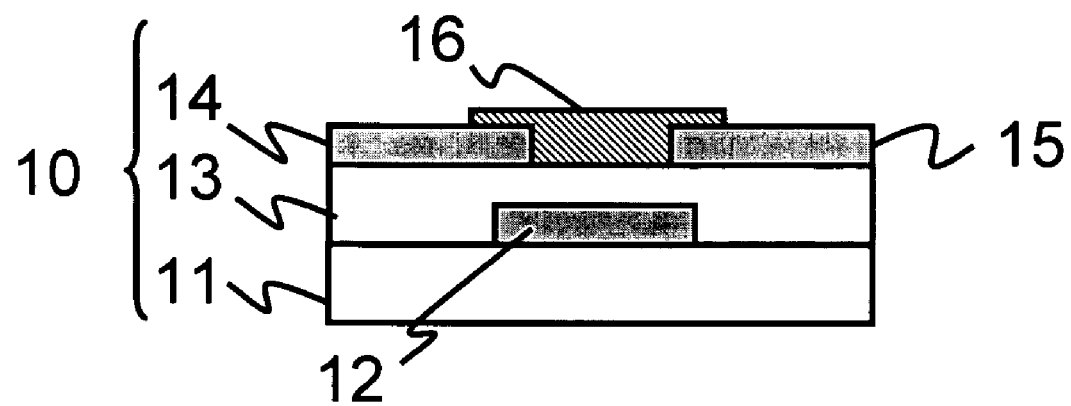
FIG. 2A to 2D are the schematic diagrams illustrating the cross sections of mentioned element in the various manufacturing processes of the organic semiconductor element, having multi protection layers according to the first embodiment of the invention.

As shown in FIG. 2A, firstly, a thin film transistor 10 is formed on a substrate, mentioned thin film transistor 10 is realized by growing sequentially a gate 12 (step 100). An insulation layer 13, a source 14, a drain 15, and an organic semiconductor layer 16 are on a substrate 11.

Figure 2B:
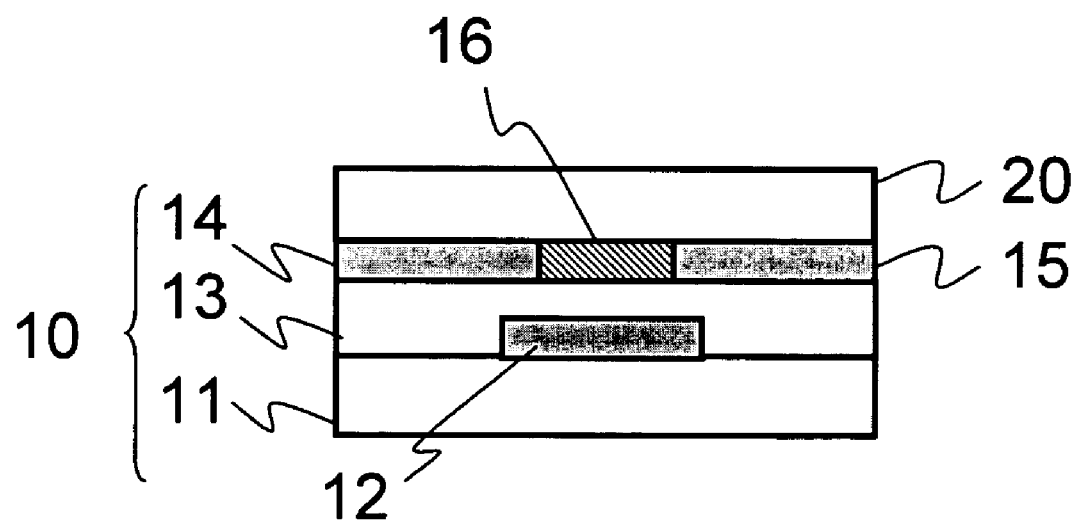

Next, as shown in FIG. 2B, the Dichromated Poly Vinyl Alcohol (DCPVA) solution is applied on the organic thin film transistor 10, which is used to form the first protection layer 20 after the exposure and baking processes.

Figure 2C:
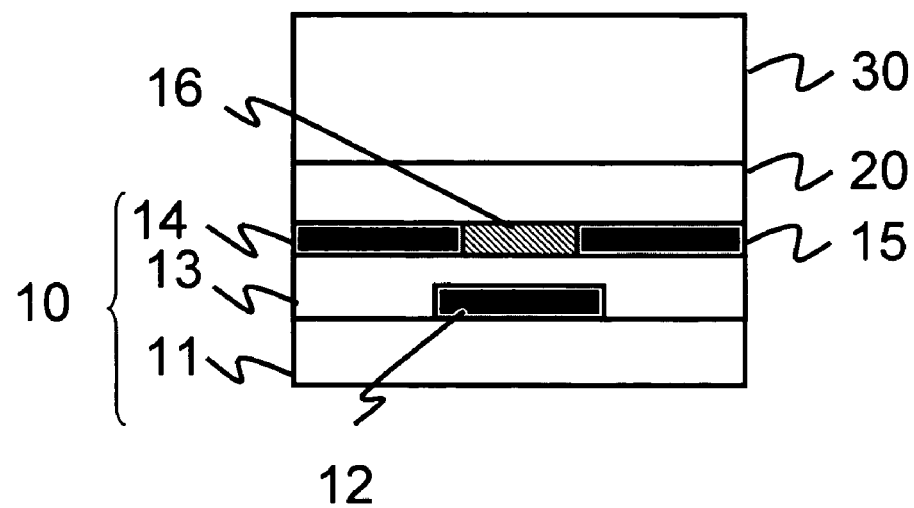

Then, as shown in FIG. 2C, a negative photoresist SU-8 2002 is applied on the first protection layer 20 by means of spin coating, to directly realize the second protection 30 of the organic thin film transistor 10 having the thickness of 5 µm.

Figure 2D:
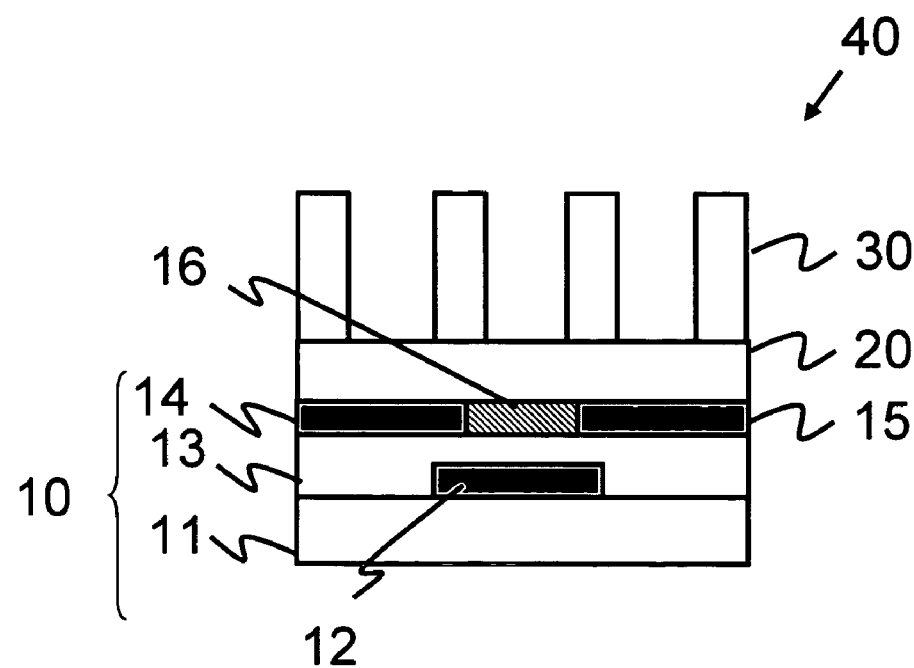

Subsequently, as shown in FIG. 2D, the second protection layer 30 is patterned through the photolithography process. Next, after removing mentioned solution, the protection layer is exposed to light by making use of a shadow mask having the exposed channels.

Then, it is developed with Propylene Glycol Monomethyl Ether Acetate (PMA) serving as the developing solution. Afterwards, it is baked to dry the solution, so as to form the second protection layer 30 composed of a plurality of photo spacer shapes on the first protection layer 20, thus finally realizing the organic semiconductor element 40 having multi protection layers of the invention.

Now, refer to FIG. 2D for the detailed description of the structure of the organic semiconductor element 40 having multi protection layers. As shown in FIG. 2D, mentioned element 40 is composed of an organic thin film transistor 10, a first protection layer 20, and a second protection layer 30. The organic thin film transistor 10 is composed of a gate 12, an insulation layer 13, a source 14, a drain 15, and an organic semiconductor layer 16 sequentially formed on the organic thin film transistor 10. The first protection layer 20 is formed on the organic thin film transistor 10, and the second protection layer 30 is formed on the first protection layer 20 by means of the patterning process, and it must be thick enough to serve as photo spacers, with its standard thickness reaching over 4 µm (5 µm in this embodiment), so that the multi protection layers 10, having the first protection layer 20 and the second protection layer 30, are capable of achieving the effect of protecting the organic thin film transistor 10.

Figure 2E:
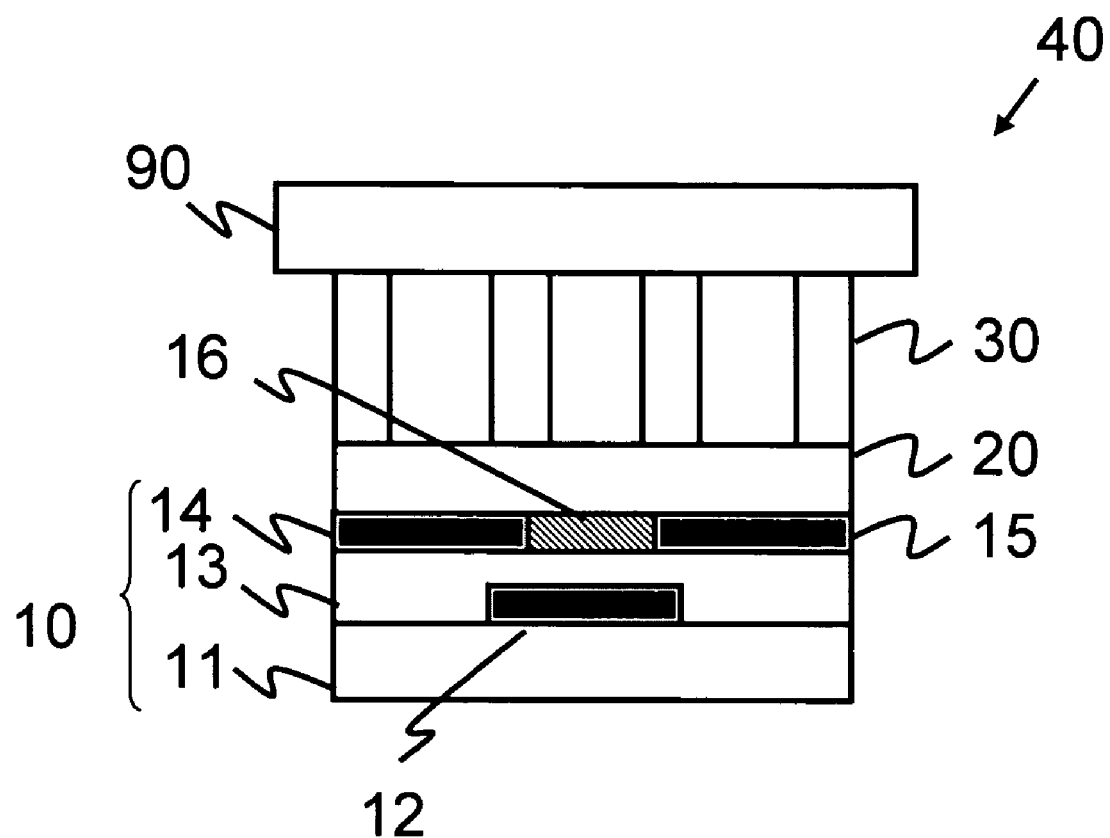
FIG. 2E is a schematic diagram of the cross section of the organic semiconductor element, having multi protection layers as shown in FIG. 2D after the inclusion of the substrate.
Figure 3A:
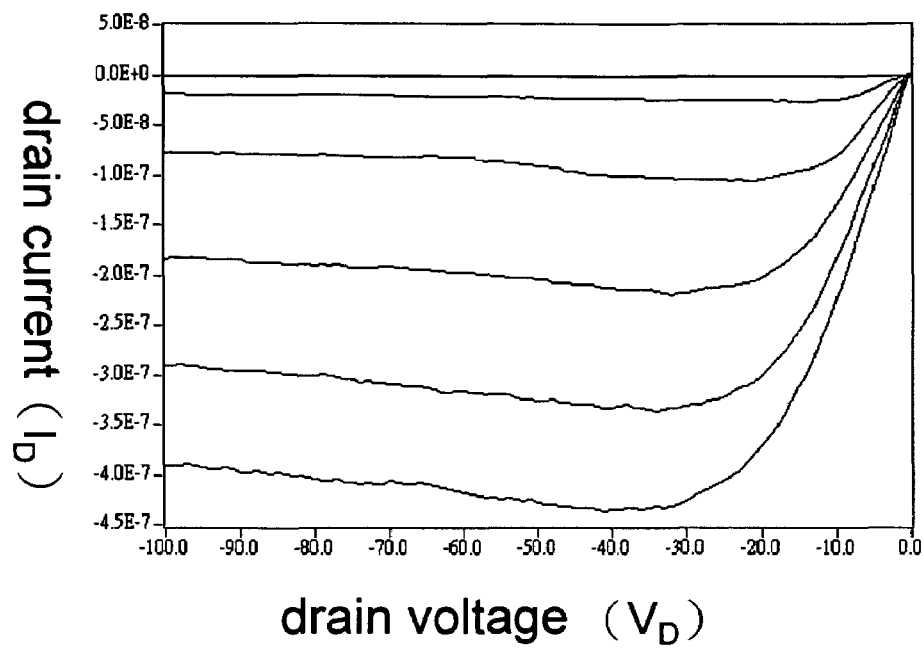
FIGS. 3A & 3B are the ID-VD characteristic curves of mentioned organic semiconductor element respectively before and after the formation of the first protection layer, using the Dichromated Poly Vinyl Alcohol (DCPVA) according to the first embodiment of the invention.
Figure 3B:
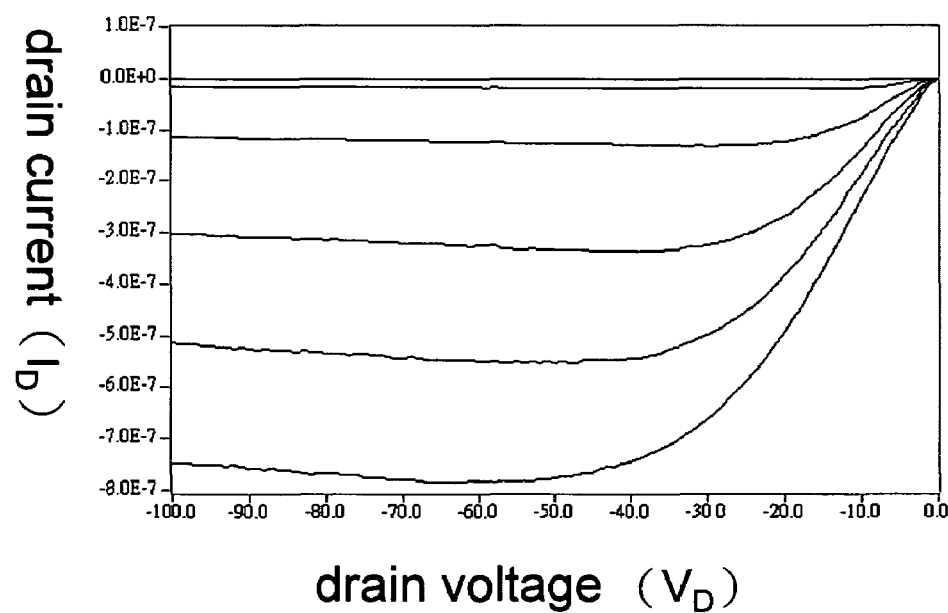
Figure 4A:
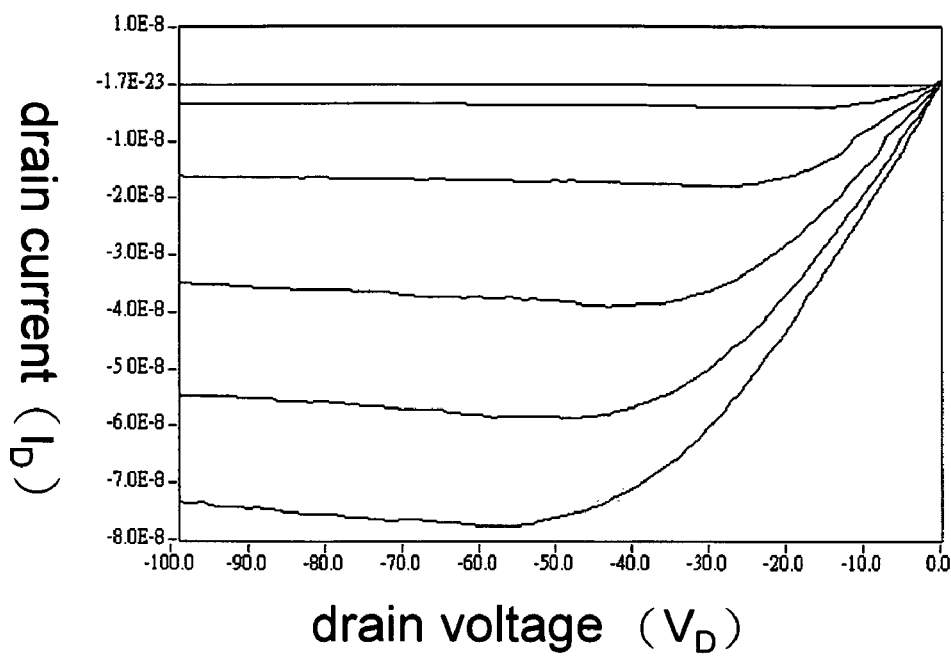
FIGS. 4A & 4B are the $I_D$-$V_D$ characteristic curves of the organic semiconductor element, respectively before and after the formation of the first protection layer, using parylene according to the first embodiment of the invention.
Figure 4B:
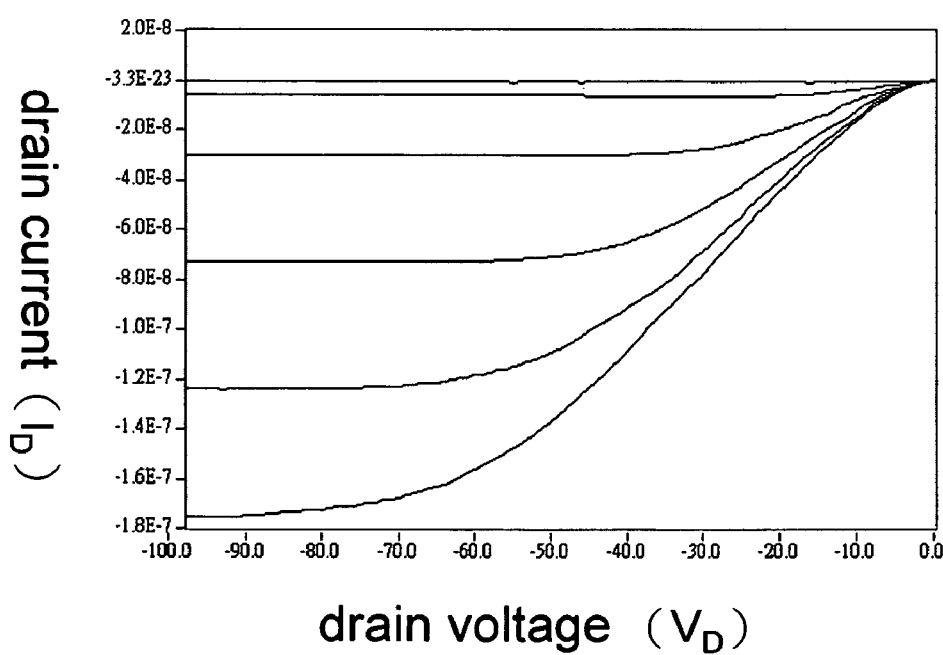

Furthermore, as shown in FIG. 2E, since the second protection layer 30 could be utilized as photo spacers to separate the substrate 90 from the organic thin film transistor 10 and the first protection layer 20 disposed thereon, as such replacing and eliminating the subsequent process of applying the photo spacers as previously done in the prior art, the photo spacers can be formed more evenly on the organic thin film transistor 10.

As mentioned earlier, in the present embodiment, the second protection layer 30 of the organic thin film transistor 10 is composed of the patterns defined by the spin coating and photolithography processes, and is thick enough to be served as photo spacers. Besides, the equipment utilized in these processes is the same as that utilized in the manufacturing process of the protection layer of the prior art, namely, the two processes can be merged into one single process, so that not only the manufacturing process can be simplified, but the cost of the equipment and production can also be significantly reduced. Moreover, since the second layer 30 utilized as the photo spacer as defined by the photolithography process indicates excellent uniformity, the quality of the organic semiconductor elements produced is improved significantly.

In the description of the above-mentioned organic semiconductor element, the organic thin firm transistor TFT 10 may be chosen from one of the following: the bottom contact type organic TFT, the top contact type organic TFT, the bottom gate type organic TFT, and the top gate type organic TFT. The first protection layer 20 and the second protection layer 30 may be formed by the vapor deposition process or the solution treatment process using different solutions, wherein the vapor deposition process may include: Chemical Vapor Deposition (CVD), Organic Chemical Vapor Deposition (OCVD) or co-evaporation process, while the solution treatment process may include: a spin coating process, a screen printing process, a inject printing process, or a spinless coating process. In addition, the developable material may be utilized to define the patterns by means of the photolithography process, or it may be utilized in cooperation with the shadow mask or laser processing, so as to realize the patterned second protection layer 30, having the functions of the photo spacers.

Subsequently, different materials are utilized to form the first protection layer according to the embodiment of the invention. Then, the protection layer is used to produce the organic semiconductor element in cooperation/combination with mentioned SU-8 2002 of the second protection layer, and is then subjected to the various electric functional tests.

Firstly, upon the completion of the process of formation of the first protection layer by making use of the Dichromated Poly Vinyl Alcohol (DCPVA) and parylene, the negative photoresist material SU-8 2002 is spin coated on mentioned first protection layer at the first revolution speed 150 rpm for 20 seconds, and the second revolution speed 300 rpm for 40 seconds respectively, to form the second protection layer 30. Then, it is heated at 35° C. in vacuum for 2 hours. Next, applying the shadow mask is applied, evaporated with pentacene on mentioned second protection layer. Then, it is exposed to light having the energy of 300 milli-joules. Afterwards, it is developed with Propylene Glycol Monomethyl Ether Acetate (PMA) as the developing solution for one minute.

Finally, it is heated at 70° C. and 130° C. respectively for one hour, thus realizing the organic semiconductor element having multi protection layers.

Now, please refer to FIG. 3A, FIG. 3B, FIG. 4A, and FIG. 4B, which show the $I_D$-$V_D$ characteristic curves of the organic semiconductor element before and after the formation of the first protection layer, by making use of the Dichromated Poly Vinyl Alcohol (DCPVA) or parylene respectively. As shown in these drawings, the electric property is better for the organic semiconductor element having its first protection layer made of DCPVA, since its $I_D$-$V_D$ characteristic curves do not indicate too many differences before and after the manufacturing process. That means that the electric property of the organic semiconductor element does not deteriorate after the manufacturing process. However, the organic semiconductor element having its first protection layer made of parylene indicates the tendency of increasing threshold voltage along with the manufacturing process. Therefore, it is determined that the organic semiconductor element, having its first protection layer made of DCPVA, may have better property and performance. Furthermore, the thickness of the second protection layer made of SU-8 2002, disposed on the two kinds of first protection layers, are both 5 μm, thus able to be utilized as the photo spacer of the organic thin film transistor.

On the other hand, when the top ITO (Indium Tin Oxide) electrode is utilized in the organic semiconductor element, since the ITO electrode is formed on top of the over-coat layer made of photo-sensitive polymer, the ITO is connected electrically to the drain of the organic thin film transistor through the contact hole in the over-coat layer, as such the over-coat layer must be extremely even, to avoid the deterioration of the electric property of the ITO thin film, due to the unevenness of the over-coat layer. According to the above-mentioned process of manufacturing, the manufacturing process of the over-coat layer can be replaced and eliminated, since the second protection layer thus produced may serve both as over-coat layer and protection layer, as such it is capable of providing a fairly even thin film surface for the top ITO electrode to put thereon.

Figure 5:
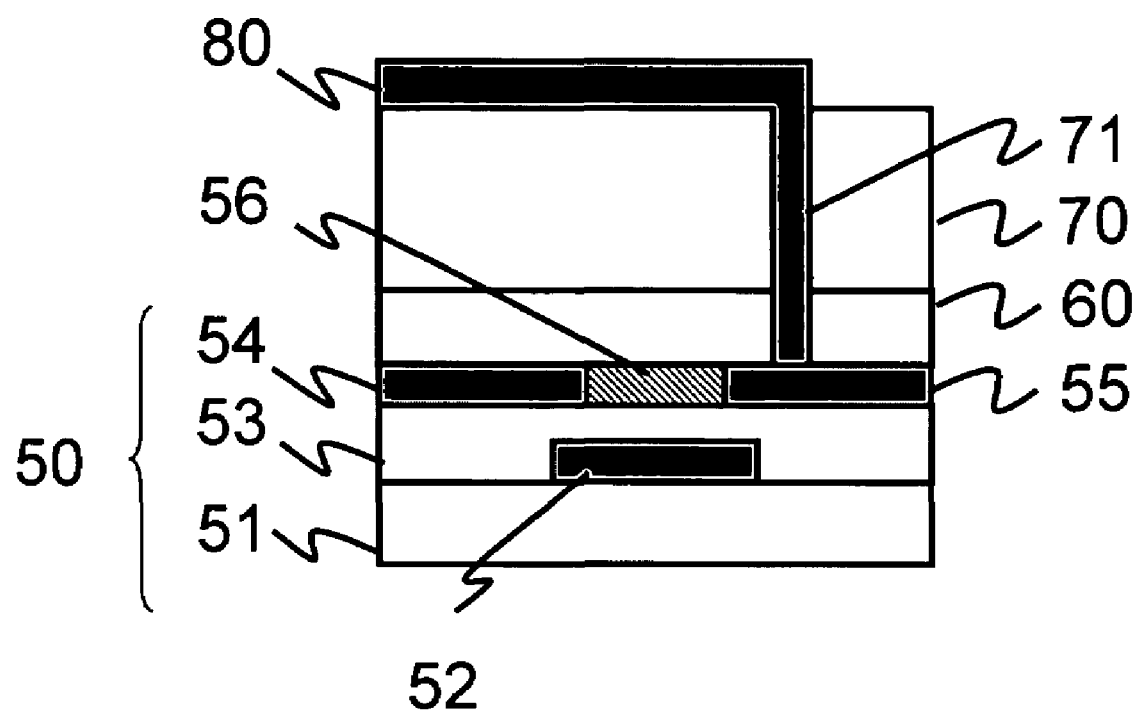
FIG. 5 is the schematic cross section diagram illustrating the organic semiconductor element having multi protection layers according to the second embodiment of the invention.

Subsequently, refer to FIG. 5 for the schematic diagram of the cross section of the organic semiconductor element, having multi protection layers according to the second embodiment of the invention. As shown in FIG. 5, the organic semiconductor element having multi protection layers comprises: an organic thin film transistor 50, a first protection layer 60, a second protection layer 70, and an electrode 80. Wherein the organic thin film transistor 50 includes a gate 52, an insulation layer 53, a source 54, a drain 55, and an organic semiconductor layer 56, sequentially formed on a substrate 51. The first protection layer 60 is formed on the organic thin film transistor 50, and the second protection layer 70 is formed on the first protection layer 60, such that the thickness of the second protection layer 70 must be greater than 4 μm, and is used to form a contact hole 71 through the patterning process. The contact hole is used to penetrate the second protection layer 70 and the first protection 60, to expose the organic thin film transistor 50. Finally, the electrode 80 is formed on top of the second protection layer 70, and is electrically connected to the drain 55 of the thin film transistor 50 via the contact hole 71. As such, the first protection layer 60 and the second protection layer 70 can be utilized to protect the organic thin film transistor 50 from being damaged. Moreover, the second protection layer 70 may also be utilized to achieve the function of over-coat layer and have fairly good evenness.

Summing up the above, the organic semiconductor element having multi protection layers and the method of its manufacturing are realized through growing the patterned second protection layer on the first protection layer, to form the multi protection layers of the thin film transistor. The multi protection layers are utilized to effectively protect the organic thin film transistor, and its second protection layer can also be used as photo spacer, to replace the subsequent process of disposing the photo spacers. In addition, the second protection layer may also be utilized to achieve the functions of both the protection layer and the over-coat layer, to replace and eliminate the manufacturing process of the over-coat layer according to the method of the invention. Therefore, the organic semiconductor element having multi protection layers and the method of its manufacturing can be utilized to maximize the protection effects of the multi protection layers, thus achieving the purpose of simplifying the manufacturing process and reducing the production cost.

Knowing the invention thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A process of making the organic semiconductor element having multi protection layers, comprising the step of
   providing an organic thin film transistor;
   forming a first protection layer on said organic thin film transistor;
   forming a second protection layer on said first protection layer, the thickness of said second protection layer is sufficient to serve as the photo spacers, wherein said second protection layer is made of a developable material, which is SU-8 2002 photoresist; and
   patterning said second protection layer, so as to form said organic semiconductor element, wherein the step of patterning said second protection layer is to form a contact hole, which is used to penetrate said protection layer and said first protection layer thus to expose said organic thin film transistor, wherein after patterning said second protection layer, the process further comprising the step of forming an electrode on said second protection layer, said electrode is connected electrically to said thin film transistor via contact hole.

2. The process of making the organic semiconductor element having multi protection layers of claim 1, wherein the thickness of said second protection layer is over 4 μm.

3. The process of making the organic semiconductor element having multi protection layers of claim 1, further comprising the step of providing a substrate, wherein said substrate is kept a distance apart from said organic thin film transistor and said first protection layer by said second protection layer.

4. The process of making the organic semiconductor element having multi protection layers of claim 1, wherein said organic thin film transistor is selected from the group consisted of the bottom contact organic thin film transistor, the top contact organic thin film transistor, the bottom gate organic thin film transistor, and the top gate organic thin film transistor.

5. The process of making the organic semiconductor element having multi protection layers of claim 1, wherein the formation method of said first protection layer and said second protection layer is selected from the group consisted of the solution treatment method and the vapor deposition method.

6. The process of making the organic semiconductor element having multi protection layers of claim 5, wherein said first protection, layer and said second protection layer are formed by the same process using different solutions.

7. The process of making the organic semiconductor element having multi protection layers of claim 5, wherein the solution treatment process is selected from the group consisted of spin coating, screen printing, inject printing, and spinless coating.

8. The process of making the organic semiconductor element having multi protection layers of claim 5, wherein the vapor deposition method is selected from the group consisted of the chemical vapor deposition (CVD) method, the organic chemical vapor deposition (OCVD) method, and the co-evaporation method.

9. The process of making the organic semiconductor element having multi protection layers of claim 1, wherein the patterning process is realized through the photolithography process.

10. The process of making the organic semiconductor element having multi protection layers of claim 1, wherein the patterning process is realized through the laser processing.

11. The process of making the organic semiconductor element having multi protection layers of claim 1, wherein said protection layer is made of the Dichromated Poly Vinyl Alcohol (DCPVA).

* * * * *